United States Patent
Seifu et al.

(10) Patent No.: US 7,348,910 B2
(45) Date of Patent: Mar. 25, 2008

(54) REFERENCE MODULE APPARATUS AND METHOD THEREFOR

(75) Inventors: Fesseha Tessera Seifu, London (GB); Marco Fornasari, Colchester (GB); Samir Aboulhouda, Ipswich (GB)

(73) Assignee: Avago Technologies General IP Pte Ltd, Singapore (SG)

( * ) Notice: Subject to any disclaimer, the term of this patent is extended or adjusted under 35 U.S.C. 154(b) by 0 days.

(21) Appl. No.: 11/481,447

(22) Filed: Jul. 6, 2006

(65) Prior Publication Data

US 2007/0030188 A1 Feb. 8, 2007

(30) Foreign Application Priority Data

Jul. 7, 2005 (GB) .................................. 0513959.7

(51) Int. Cl.
*H03M 1/66* (2006.01)
(52) U.S. Cl. ...................... 341/144; 341/117; 341/118; 341/119; 341/120
(58) Field of Classification Search .............. 341/144, 341/117–120; 327/349, 348; 324/106; 708/807; 331/57
See application file for complete search history.

(56) References Cited

U.S. PATENT DOCUMENTS

| 3,723,845 | A | * | 3/1973 | Duckworth | ................. 324/106 |
| 5,274,582 | A | * | 12/1993 | Whitby | ....................... 708/807 |
| 5,585,757 | A | * | 12/1996 | Frey | ........................... 327/348 |
| 5,714,911 | A | * | 2/1998 | Gilbert | ......................... 331/57 |
| 6,172,549 | B1 | * | 1/2001 | Gilbert | ....................... 327/349 |
| 6,204,719 | B1 | | 3/2001 | Gilbert | ....................... 327/349 |
| 6,348,829 | B1 | * | 2/2002 | Gilbert | ....................... 327/349 |
| 6,549,057 | B1 | | 4/2003 | Gilbert | ....................... 327/349 |

\* cited by examiner

*Primary Examiner*—Jean Bruner Jeanglaude

(57) ABSTRACT

A Root Mean Square (RMS) detector circuit includes a first differential pair circuit arranged to operate in a common mode. The detector circuit also includes a compensation circuit unit having a second differential pair circuit to duplicate an unwanted base current drawn by the first differential pair circuit. The compensation circuit unit is arranged to generate an offset voltage using the duplicated base current. The compensation circuit unit also has an operational amplifier coupled to an NMOS transistor so as to generate a corrective current corresponding to the offset voltage, the corrective current being mirrored by a current mirror and provided as a compensatory current to an input of the first differential pair circuit.

14 Claims, 1 Drawing Sheet

REFERENCE MODULE APPARATUS AND METHOD THEREFOR

BACKGROUND OF THE INVENTION

1. Field of the Invention

The present invention relates to a reference module apparatus of the type, for example, that serves to provide a reference voltage for performance of a measurement or detection, for example in a Root Means Square (RMS) detector circuit. The present invention also relates to a method of compensating for a base current of the type, for example, drawn by a reference circuit, such as a differential pair circuit, of an RMS detector circuit.

2. Description of the Related Art

In the field of optical equalisation, it is currently desirable to develop Integrated Circuits (ICs) to extend electrically the optical transmission distance achievable at 10 Gb/s over multi-mode fibre. A short-term goal is to achieve lossless data transmission at 10 Gb/s over 300 metres of multi-mode grade fibre. Currently, an equalizer architecture sufficiently robust to achieve the 300 metres of lossless transmission consistently is not available. Work is thus underway in a number of companies to improve the equalizer algorithms and their implementations in silicon and software to achieve this 300 meter goal.

In this respect, a post-amplifier Automatic Gain Control (AGC) circuit is employed as part of an integrated circuit to perform the above-described optical equalisation, the AGC circuit being provided for the purpose of so-called Electronic Dispersion Compensation (EDC). In some AGC circuits, a so-called RMS detector circuit is employed in order to detect a swing of a peak-to-peak input signal so as to be able to adjust a gain of the AGC circuit to maintain a peak-to-peak output signal of the AGC circuit within certain pre-defined limits.

Typically, the RMS detector circuit comprises two differential pair amplifiers coupled together, one operating in a difference mode and the other operating in a common mode. The differential pair circuit operating in the common mode is employed to generate a reference signal. However, due to the nature of bipolar transistors used in the common-mode differential pair circuit, base currents draw by the bipolar transistors introduce an error into the reference signal in the form of an offset voltage.

One known solution to the errors introduced is to replace the bipolar transistors with Metal Oxide Semiconductor Field Effect Transistors (MOSFETs), since MOSFETs are known to possess high input impedances. However, for channel equalisation, maintenance of low offsets and high bandwidths is important. This is particularly true in respect of high-speed implementations of differential RMS detector circuits. In this respect, MOSFETs introduce greater offsets than bipolar transistors.

Additionally, the offset introduced by base currents of the bipolar transistors varies with temperature and process variation, i.e. the variation between instances of a given integrated circuit on different semiconductor wafers.

SUMMARY OF THE INVENTION

According to a first aspect of the present invention, there is provided a reference module apparatus for a Root Mean Square (RMS) detector circuit, the apparatus comprising: a first differential pair circuit having first inputs coupled together so as to operate, when in use, in a common mode; a second differential pair circuit having second inputs coupled together so as to operate, when in use, in the common mode; a current feedback circuit comprising a first differential input coupled to a tail of the first differential pair circuit and a second differential input coupled to a second tail of the second differential pair circuit, the current feedback circuit being arranged to generate, when in use, a corrective current in response to a difference in voltages applied between the first and second differential inputs; wherein the first and second differential pair circuits are arranged so as to generate, when in use, an offset between a first tail voltage at the first tail and a second tail voltage at the second tail, the offset corresponding to a base current drawn by the second differential pair circuit; and a compensation current corresponding to the corrective current is applied, when in use, to the first inputs of the first differential pair circuit.

The first inputs of the first differential pair circuit may be held at a first potential and the second inputs of the second differential pair circuit may be held at a second potential, a potential difference between the first potential and the second potential corresponding to the base current drawn, when in use, by the second differential pair circuit. A first tail potential may be associated with the first potential and a second tail potential may be associated with the second potential.

A load may be coupled between the first inputs of the first differential pair circuit and the second inputs of the second differential pair circuit.

The first and second differential pair circuits may respectively comprise a first tail node and a second tail node. The first tail node and the second tail node may be respectively coupled to ground potential via a first current source and a second current source.

The first tail node may be coupled to a first filter. An output of the first filter may be coupled to a first level shifter.

The current feedback circuit may further comprise: a current mirror arranged to generate, when in use, a duplicate of the corrective current in response to the corrective current. The duplicate of the corrective current may be the compensation current.

The apparatus may further comprise: a third differential pair circuit arranged to operate, when in use, in a difference mode.

According to a second aspect of the present invention, there is provided an rms detector circuit comprising the reference module apparatus as set forth above in relation to the first aspect of the invention.

According to a third aspect of the present invention, there is provided a channel equaliser comprising the reference module apparatus as set forth above in relation to the first aspect of the invention. The channel may be an optical channel.

According to a fourth aspect of the present invention, there is provided a method of compensating for a base current drawn by a first differential pair circuit for a root mean square (rms) detector circuit, the method comprising the steps of: duplicating the base current drawn by the first differential pair circuit, the first differential pair circuit being arranged to operate in a common mode; generating an offset voltage using the duplicated base current drawn; generating a corrective current corresponding to the offset voltage; providing a compensatory current corresponding to the corrective current to an input of the first differential pair circuit.

It is thus possible to provide a reference module apparatus and a method of compensating a base current that overcomes an offset error introduced by base currents drawn by the base terminals of bipolar transistors of the first differential pair circuit of the reference module apparatus in high-speed peak or Root Mean Square (RMS), detection applications. The apparatus and method also obviates effects of process variations in current sources between integrated circuits in relation to and comprising the reference module apparatus, thereby increasing integrated circuit fabrication yields. The above method and apparatus also obviates, or at least mitigates, the effects of temperature variations in relation to current sources in the reference module apparatus.

DESCRIPTION OF THE INVENTION

Figure 1:
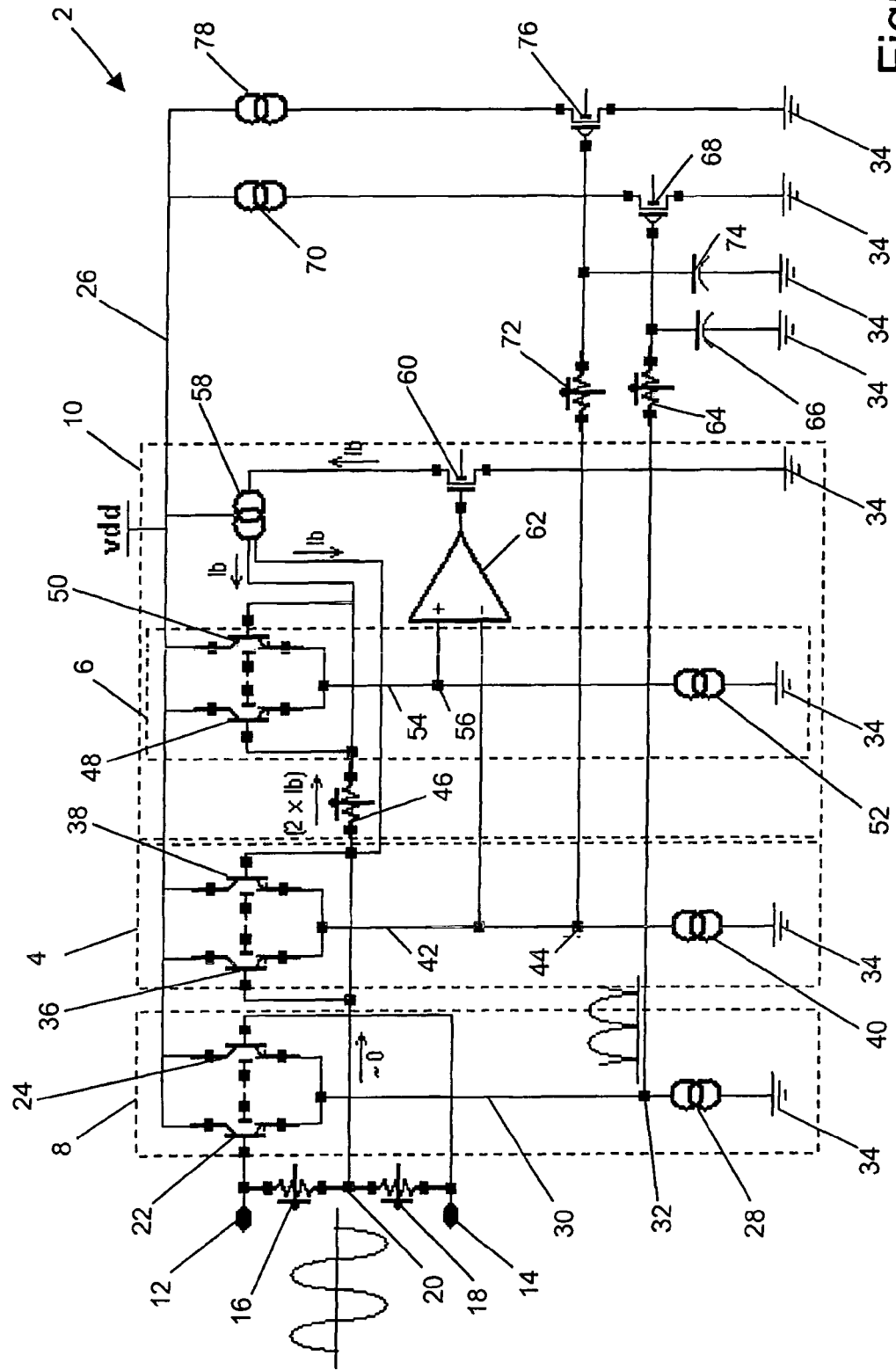
FIG. 1 is a schematic diagram of an integrated circuit constituting an embodiment of the invention.

At least one embodiment of the invention will now be described, by way of example only, with reference to the accompanying FIG. 1, which is a schematic diagram of an integrated circuit constituting an embodiment of the invention.

Throughout the following description identical reference numerals will be used to identify like parts.

Referring to FIG. 1, a post-amplifier (not shown) for Automatic Gain Control (AGC) purposes in an equaliser circuit (also not shown) comprises a Root Mean Square (RMS) detector circuit 2. The detector circuit 2 comprises a reference module apparatus comprising a first differential pair circuit unit 4 and a second differential pair circuit unit 6. A third differential pair circuit unit 8 is also provided as part of the detector circuit 2. The second differential pair circuit 6 is part of a compensation circuit unit 10.

A first differential input terminal 12 of the detector circuit 2 is coupled to a second differential input terminal 14 of the detector circuit 2 via a voltage divider circuit arrangement comprising a first resistor 16 coupled to the first differential input terminal 12 and a second resistor 18, the second resistor 18 also being coupled to the second differential input terminal 14 and a junction between the first and second resistors 16, 18 constituting a first node 20. The first and second resistors 16, 18 have a same resistance value.

The first differential input terminal 12 is also coupled to a base terminal of a first npn bipolar transistor 22 of the third differential pair circuit 8. Likewise, the second differential input terminal 14 is coupled to a base terminal of a second npn bipolar transistor 24 of the third differential pair circuit 8. The third differential pair circuit 8 is thus arranged to operate in a difference mode. Collector terminals of the first and second bipolar transistors 22, 24 are coupled to a positive supply rail 26 maintained at a potential of Vdd volts. Emitter terminals of the first and second bipolar transistors 22, 24 are coupled together, the coupled emitter terminals of the first and second bipolar transistors 22, 24 being coupled to a first current source 28 via a first tail 30. The first trail 30 being coupled to the first current source 28 via a second node 32, the first current source 28 being coupled to an earth rail 34, maintained at ground potential.

The first node 20 is coupled to base terminals of a third npn bipolar transistor 36 of the first differential pair circuit 4 and a fourth npn bipolar transistor 38 of the first differential pair circuit 4, respectively, the base terminals of the third and fourth bipolar transistors 36, 38 being coupled together. Collector terminals of the third and fourth bipolar transistors 36, 38 are coupled to the positive supply rail 26. Emitter terminals of the third and fourth bipolar transistors 36, 38 are coupled together, the coupled emitter terminals of the third and fourth bipolar transistors 36, 38 being coupled to a second current source 40 via a second tail 42. The second trail 42 being coupled to the second current source 40 via a third node 44, the second current source 40 being coupled to the earth rail 34.

The first node 20, and hence the base terminals of the third and fourth bipolar transistors 36, 38, is also coupled to a first terminal of a third resistor 46 of the compensation circuit unit 10. A second terminal of the third resistor 46 is coupled to base terminals of a fifth npn bipolar transistor 48 of the second differential pair circuit 6 and a sixth npn bipolar transistor 50 of the second differential pair circuit 6, respectively. Collector terminals of the fifth and sixth bipolar transistors 48, 50 are coupled to the positive supply rail 26. Emitter terminals of the fifth and sixth transistors 48, 50 are coupled together, the coupled emitter terminals of the fifth and sixth bipolar transistors 48, 50 also being coupled to a third current source 52 via a third tail 54. The third trail 54 being coupled to the third current source 52 via a fourth node 56, the third current source 52 being coupled to the earth rail 34.

The first terminal of the third resistor 46 is coupled to a first output terminal of a current mirror 58, and the base terminals of the fifth and sixth bipolar transistors 48, 50 (and hence the second terminal of the third resistor 46) are coupled to a second output terminal of the current mirror 58. An input terminal of the current mirror 58 is coupled to a drain terminal of an N-channel Metal Oxide Semiconductor (NMOS) transistor 60. A source terminal of the NMOS transistor 60 is coupled to the earth rail 34, and a gate terminal of the NMOS transistor 60 being coupled to an output terminal of an operational amplifier 62.

The operational amplifier 62 has a non inverting input terminal coupled to the fourth node 56 and hence the third tail 54, and an inverting input terminal coupled to the second tail 42.

The second node 32 is coupled to a first terminal of a fourth resistor 64, a second terminal of the fourth resistor 64 being coupled to a first terminal of a first capacitor 66 and a gate terminal of a first P-channel Metal Oxide Semiconductor (PMOS) transistor 68. A second terminal of the first capacitor 66 is coupled to the earth rail 34. A drain terminal of the first PMOS transistor 68 is coupled to the positive supply rail 26 via a fourth current source 70, a source terminal of the first PMOS transistor 68 being coupled to the earth rail 34.

The third node 44 is coupled to a first terminal of a fifth resistor 72, a second terminal of the fifth resistor 72 being coupled to a first terminal of a second capacitor 74 and a gate terminal of a second PMOS transistor 76. A second terminal of the second capacitor 74 is coupled to the earth rail 34. A drain terminal of the second PMOS transistor 76 is coupled to the positive supply rail 26 via a fifth current source 78, a source terminal of the second PMOS transistor 76 being coupled to the earth rail 34.

In operation, the first and second differential input terminals 12, 14 receive a peak-to-peak differential input signal. A rectified output signal constituting a rectified version of the peak-to-peak differential input signal is generated by the third differential pair circuit 8 and is present at the second node 32. The peak-to-peak differential input signal is also divided by the voltage divider arrangement comprising the first and second resistors 16, 18 and applied via the first node 20 to the tied base terminals of the first differential pair circuit 4. Since the base terminals of the third and fourth input bipolar transistors 36, 38 are tied together, the first differential pair circuit 4 operates in a common mode, the divided peak-to-peak differential input signal constituting a common mode input signal. In response to the divided peak-to-peak differential input signal, the first differential pair circuit 4 generates a reference output voltage of the detector circuit 2 at the third node 44.

The rectified output signal is then filtered by the fourth resistor 64 coupled to the first capacitor 66 to yield a first RMS value of the rectified output signal, the first RMS value being level shifted by the first PMOS transistor 68 and the fourth current source 70. Likewise, the reference output voltage is filtered by the fifth resistor 72 coupled to the second capacitor 74 to yield a second RMS value of the reference output voltage, the second RMS value being level shifted by the second PMOS transistor 76 and the fifth current source 78.

Turning to the potential divider circuit arrangement, in an ideal case, when no transient voltage signal is applied across the first and second differential input terminals 12, 14, i.e. no peak-to-peak differential input signal, no base current is drawn by the first differential pair circuit 4 and so the potential at the first differential input terminal 12, the second differential input terminal 14, and the first node 20 should be equal, implying that the detector circuit 2 is biased correctly. Consequently, a differential output signal of a differential peak-detector circuit formed by the first and third differential pair circuits 4, 8 should be zero, since first and second tail currents flowing through the first and second tails 30, 42 should be equal as a result of the first, second, third and fourth bipolar transistors 22, 24, 36, 38 being of equal size.

However, under real operating conditions, a first base current of the third bipolar transistor 36 and a second base current of the fourth bipolar transistor 38 are drawn, thereby introducing an error in the form of an error offset voltage component in the differential output signal of the differential peak-detector circuit mentioned above; the error offset voltage component affects the reference output voltage at the third node 44 and varies with temperature and/or process. Hereinafter, the first and second base currents of the third and fourth bipolar transistors 36, 38 will simply be referred to as the "a first base current of the first differential pair circuit".

In order to remove the error offset voltage component introduced by the base current of the first differential pair circuit 4, the compensation circuit 10 is employed. The compensation circuit 10 makes use of a negative feedback circuit (comprising the operational amplifier 62, the NMOS transistor 60, the current mirror 58 and the third resistor 46) in order to generate a corrective current in order to correct for the base current drawn by the first differential pair circuit 4. In this respect, the second differential pair circuit 6 mimics operation of the first differential pair circuit 4. Consequently, the second differential pair circuit 6 also draws a second base current equal to the first base current of the first differential pair circuit 4. The second differential base current of the second differential pair circuit 6 flows through the third resistor 46 resulting in an offset potential difference being formed between the first and second terminals of the third resistor 46. The offset potential difference formed across the third resistor 46 corresponds to the second, and the first and second base currents drawn by the first and second differential pair circuits 4, 6. Hence, the base terminals of the second and third bipolar transistors 36, 38 are held at a first offset potential and the base terminals of the fifth and sixth bipolar transistors 48, 50 are held at a second offset potential.

Since the fifth and sixth bipolar transistors 48, 50 are of a same size as the third and fourth bipolar transistors 36, 38, a third tail current that flows through the third tail 54 is equal to the second tail current that flows through the second tail 42.

The first offset potential at the first terminal of the third resistor 46 is translated into a first tail potential across the second current source 40. Likewise, the second offset potential at the second terminal of the third resistor 46 is translated into a second tail potential across the third current source 52. Consequently, a differential offset voltage is applied across the inverting and non-inverting input terminals of the operational amplifier 62, the operational amplifier 62 generating a corrective output voltage in response to the differential offset voltage. The corrective output voltage is translated into the corrective current by the NMOS transistor 60.

The corrective current is then duplicated by the current mirror 58 to form a compensation current, the compensation current being fed back to the base terminals of the first differential pair circuit 4 and the base terminals of the second differential pair circuit 6, respectively. The operational amplifier 62 in the feedback loop circuit hence forces the differential offset voltage across the inverting and non-inverting input terminals of the operational amplifier to zero.

Due to the flow of the compensation current into the base terminals of the first differential pair circuit 4, no current flows from the first node 20. Therefore, the first and second differential input terminals 12, 14 and the first node 20 are at a same potential and hence the voltages across the first, second and third current mirrors 28, 40, 52 are the same potential when the detector circuit 2 is biased correctly, and no transient signal is applied across the first and second differential input terminals 12, 14. The error offset voltage component due to the first base current of the first differential pair circuit 4 is therefore removed.

Consequently, when the detector circuit 2 is biased correctly and a transient voltage signal is applied across the first and second differential input terminals 12, 14, a differential RMS voltage signal across the drain terminals of the first and second PMOS transistors 68, 76 corresponds to an RMS voltage signal across the second and third nodes 32, 44 without the influence of the error offset voltage component due to the base current drawn by the first differential pair circuit 4.

The invention claimed is:

1. A reference module apparatus for a root mean square (rms) detector circuit, the apparatus comprising:
   a first differential pair circuit having first inputs coupled together so as to operate, when in use, in a common mode;
   a second differential pair circuit having second inputs coupled together so as to operate, when in use, in the common mode;
   a current feedback circuit comprising a first differential input coupled to a tail of the first differential pair circuit and a second differential input coupled to a second tail of the second differential pair circuit, the current feedback circuit being arranged to generate, when in use, a corrective current in response to a difference in voltages applied between the first and second differential inputs; wherein
   the first and second differential pair circuits are arranged so as to generate, when in use, an offset between a first tail voltage at the first tail and a second tail voltage at the second tail, the offset corresponding to a base current drawn by the second differential pair circuit; and a compensation current corresponding to the corrective current is applied, when in use, to the first inputs of the first differential pair circuit.

2. An apparatus as claimed in claim 1, wherein the first inputs of the first differential pair circuit are held at a first potential and the second inputs of the second differential pair circuit are held at a second potential, a potential difference between the first potential and the second potential corresponding to the base current drawn, when in use, by the second differential pair circuit.

3. An apparatus as claimed in claim 2, wherein a first tail potential is associated with the first potential and a second tail potential is associated with the second potential.

4. An apparatus as claimed in claim 1, wherein a load is coupled between the first inputs of the first differential pair circuit and the second inputs of the second differential pair circuit.

5. An apparatus as claimed in claim 1, wherein the first and second differential pair circuits respectively comprise a first tail node and a second tail node.

6. An apparatus as claimed in claim 5, wherein the first tail node and the second tail node are respectively coupled to ground potential via a first current source and second current source.

7. An apparatus as claimed in claim 5, wherein the first tail node is coupled to a first filter.

8. An apparatus as claimed in claim 7, wherein an output of the first filter is coupled to a first level shifter.

9. An apparatus as claimed in claim 1, wherein the current feedback circuit further comprises:
   a current mirror arranged to generate, when in use, a duplicate of the corrective current in response to the corrective current.

10. An apparatus as claimed in claim 9, wherein the duplicate of the corrective current is the compensation current.

11. An apparatus as claimed in claim 1, further comprising:
   a third differential pair circuit arranged to operate, when in use, in a difference mode.

12. A root mean square (rms) detector circuit comprising the reference module apparatus comprising:
   a first differential pair circuit having first inputs coupled together so as to operate, when in use, in a common mode;
   a second differential pair circuit having second inputs coupled together so as to operate, when in use, in the common mode;
   a current feedback circuit comprising a first differential input coupled to a tail of the first differential pair circuit and a second differential input coupled to a second tail of the second differential pair circuit, the current feedback circuit being arranged to generate, when in use, a corrective current in response to a difference in voltages applied between the first and second differential inputs; wherein
   the first and second differential pair circuits are arranged so as to generate, when in use, an offset between a first tail voltage at the first tail and a second tail voltage at the second tail, the offset corresponding to a base current drawn by the second differential pair circuit; and
   a compensation current corresponding to the corrective current is applied, when in use, to the first inputs of the first differential pair circuit.

13. A channel equaliser comprising the reference module apparatus comprising:
   a first differential pair circuit having first inputs coupled together so as to operate, when in use, in a common mode;
   a second differential pair circuit having second inputs coupled together so as to operate, when in use, in the common mode;
   a current feedback circuit comprising a first differential input coupled to a tail of the first differential pair circuit and a second differential input coupled to a second tail of the second differential pair circuit, the current feedback circuit being arranged to generate, when in use, a corrective current in response to a difference in voltages applied between the first and second differential inputs; wherein
   the first and second differential pair circuits are arranged so as to generate, when in use, an offset between a first tail voltage at the first tail and a second tail voltage at the second tail, the offset corresponding to a base current drawn by the second differential pair circuit; and
   a compensation current corresponding to the corrective current is applied, when in use, to the first inputs of the first differential pair circuit.

14. A method of compensating for a base current drawn by a first differential pair circuit for a root mean square (rms) detector circuit, the method comprising the steps of:
   duplicating the base current drawn by the first differential pair circuit, the first differential pair circuit being arranged to operate in a common mode;
   generating an offset voltage using the duplicated based current drawn;
   generating a corrective current corresponding to the offset voltage;
   providing a compensatory current corresponding to the corrective current to an input of the first differential pair circuit.

* * * * *